United States Patent
Nunokawa

[11] Patent Number: 5,811,861
[45] Date of Patent: Sep. 22, 1998

[54] SEMICONDUCTOR DEVICE HAVING A POWER SUPPLY VOLTAGE STEP-DOWN CIRCUIT

[75] Inventor: Hideo Nunokawa, Kawasaki, Japan

[73] Assignee: Fujitsu Limited, Kawasaki, Japan

[21] Appl. No.: 684,396

[22] Filed: Jul. 19, 1996

[30] Foreign Application Priority Data

Jan. 19, 1996 [JP] Japan .................................. 8-007875

[51] Int. Cl.$^6$ .................................................. H01L 29/76
[52] U.S. Cl. .......................... 257/379; 323/282; 307/66; 307/110
[58] Field of Search ..................... 348/730, 380, 348/691, 690; 323/287, 282, 290; 307/66, 110; 257/379

[56] References Cited

U.S. PATENT DOCUMENTS

| | | | |
|---|---|---|---|
| 3,594,499 | 7/1971 | Sansone et al. | 348/730 |
| 3,641,267 | 2/1972 | Cavallari | 348/730 |
| 4,350,948 | 9/1982 | Meroni | 323/282 |
| 5,457,421 | 10/1995 | Tanabe | 327/530 |

*Primary Examiner*—Carl W. Whitehead, Jr.
*Attorney, Agent, or Firm*—Staas & Halsey

[57] ABSTRACT

A voltage step-down circuit includes a first transistor having an input terminal supplied with a first power supply voltage, an output terminal and a control terminal. A step-down voltage derived from the first power supply voltage is output through the output terminal when a load circuit to be driven by the voltage step-down circuit is in an active mode. The first transistor is OFF when the load circuit is in a standby mode. A first voltage dividing circuit has an input terminal connected to the output terminal of the first transistor, and an output terminal. A first control circuit controls a voltage of the control terminal of the first transistor so that, when the load circuit is in the active mode, a feedback control is performed on the basis of a result of comparing a reference voltage with a voltage of the output terminal of the first voltage dividing circuit, and so that, when the load circuit is in the standby mode, the feedback control is stopped and the first transistor is OFF. A resistance element cooperates with the first voltage dividing circuit so that a second voltage dividing circuit is formed, so as to divide the first power supply voltage when the load circuit is in the standby mode and so that the step-down voltage is applied to the load circuit via the resistance element.

16 Claims, 11 Drawing Sheets

SEMICONDUCTOR DEVICE HAVING A POWER SUPPLY VOLTAGE STEP-DOWN CIRCUIT

BACKGROUND OF THE INVENTION

1. Field of the Invention

The present invention relates to a power supply voltage step-down circuit which steps down a power supply voltage, and a semiconductor device equipped with such a step-down circuit.

Recently, there has been considerable progress in the process of producing semiconductor devices and there has become available a semiconductor device which has a fine pattern which has a breakdown voltage lower than 5 V. Nowadays, there is a further activity in increasing the integration density and reducing power consumption.

However, there are many existing systems using semiconductor devices driven by a power supply voltage of 5 V. A power supply voltage step-down circuit is used when semiconductor devices having a breakdown voltage lower than 5 V are applied to such systems. Such a power supply voltage step-down circuit steps down (drops) the power supply voltage of 5 V to a step-down voltage equal to, for example, 3 V. The step-down voltage is then applied to internal circuits of the semiconductor devices.

2. Description of the Related Art

FIG. 1 is a circuit diagram of a part of a semiconductor device equipped with a conventional power supply voltage step-down circuit. A power supply voltage step-down circuit 2 receives, through a power supply voltage input terminal 1, an external power supply voltage VPP equal to, for example, 5 V, and outputs a step-down output voltage VOUT equal to, for example, 3 V. A load circuit 3 receives the step-down voltage VOUT as a power supply voltage and operates under the voltage VOUT.

The step-down circuit 2 includes a PMOS transistor 4, and resistors 5 and 6. The pMOS transistor 4 functions to step down the power supply voltage VPP to thereby generate the step-down output voltage VOUT applied to the load circuit 3. The resistors 5 and 6, which form a voltage dividing circuit, divide the step-down output voltage VOUT in order to detect the value of the voltage VOUT. The ratio of the resistance values of the resistors 5 and 6 determine the value of the step-down output voltage VOUT.

The step-down circuit 2 includes a reference voltage generating circuit 7 and an operational amplifier 8. The reference voltage generating circuit 7 generates a reference voltage VREF equal to, for example, 1.24 V. The operational amplifier 4 functions as a control circuit that controls the gate voltage of the pMOS transistor 4. The operational amplifier 8 has an inverting input terminal connected to the output terminal of the reference voltage generating circuit 7, and a non-inverting input terminal connected to a node N1 (which corresponds to the output terminal of the voltage dividing circuit made up of the resistors 5 and 6). The output terminal of the operational amplifier 8 is connected to the gate of the pMOS transistor 4.

The operational amplifier 8 compares the voltage of the node N1 with the reference voltage VREF and outputs a resultant control voltage to the gate of the pMOS transistor 4 so that the stable step-down output voltage VOUT, always equal to 3 V, can be obtained by the above feedback control.

When the semiconductor device equipped with the above-mentioned step-down circuit 2 is in a standby mode, that is, when the load circuit 3 is in a completely inactive state, the step-down circuit 2 operates in the same manner as in an active mode. Hence, energy (power) is consumed in the reference voltage generating circuit 7 and the operational amplifier 8. The above consumption prevents a reduction in power consumption.

One may consider the following in order to avoid the above problem. The reference voltage generating circuit 7 and the operational amplifier 8 may be maintained in the inactive state in the standby mode in order to prevent these components from consuming energy to avoid wasteful power consumption. However, in this case, the step-down circuit 2 cannot supply the step-down voltage VOUT to the load circuit 3 at all. If the load circuit 3 has a data holding function, such data will be lost.

The above semiconductor device has another problem as described below. When the semiconductor device shifts to a state in which no current flows in the load circuit 3 in the active mode, the pMOS transistor 4 is changed to a state substantially equivalent to the OFF state. Hence, the current flowing out of the pMOS transistor 4 is decreased. In this state, at the moment the current starts to flow in the load circuit 3, a ripple occurs in the step-down voltage VOUT. The ripple may cause the load circuit 3 to malfunction.

The semiconductor device has yet another problem. The pMOS transistor 4 is integrally formed on a chip. If a large amount of current flows in the load circuit 3, the junction of the pMOS transistor 4 will have a relatively high temperature. In this case, the transistors contained in the load circuit 3 have different characteristics dependent on the positions of the transistors. Hence, a racing effect will occur in the load circuit 3, which will cause a malfunction.

SUMMARY OF THE INVENTION

It is a general object of the present invention to provide a power supply voltage step-down circuit and a semiconductor device using the same, in which the above disadvantages are eliminated.

A more specific object of the present invention is to provide a power supply voltage step-down circuit capable of supplying a step-down voltage to a load circuit when the load circuit is in the standby mode to thereby maintain a data holding function of the load circuit while consuming a smaller amount of energy.

Another object of the present invention is to provide a power supply voltage step-down circuit capable of supplying a step-down voltage to a load circuit without any ripple in the step-down voltage when a current flow restarts in the load circuit from a state in which no current flows therein, thereby preventing the load circuit from malfunctioning.

Yet another object of the present invention is to provide a power supply voltage step-down circuit which can supply a step-down voltage to a load circuit without any ripple in the step-down voltage when a current flow restarts in the load circuit from a state in which no current flows therein. This arrangement prevents the load circuit from malfunctioning and, further, can supply the step-down voltage to the load circuit when the load circuit is in the standby mode, to thereby maintain a data holding function of the load circuit and reduce consumption of energy.

A further object of the present invention is to provide a semiconductor device equipped with the power supply voltage as described above, so that an increase of the junction temperature of a transistor to step down a power supply voltage can be prevented and the reliability of the semiconductor device can be improved.

The above objects of the present invention are achieved by a voltage step-down circuit comprising a first transistor having an input terminal supplied with a first power supply voltage, an output terminal and a control terminal, a step-down voltage derived from the first power supply voltage being output through the output terminal when a load circuit to be driven by the voltage step-down circuit is in an active mode, the first transistor being OFF when the load circuit is in a standby mode; a first voltage dividing circuit having an input terminal connected to the output terminal of the first transistor, and an output terminal; a first control circuit which controls a voltage of the control terminal of the first transistor so that, when the load circuit is in the active mode, a feedback control is performed on the basis of a result of comparing a reference voltage with a voltage of the output terminal of the first voltage dividing circuit, and that, when the load circuit is in the standby mode, the feedback control is stopped and the first transistor is OFF; and a resistance element which cooperates with the first voltage dividing circuit so that a second voltage dividing circuit is formed so as to divide the first power supply voltage when the load circuit is in the standby mode so that the step-down voltage is applied to the load circuit via the resistance element.

The above voltage step-down circuit may further comprise a reference voltage generating circuit which generates the reference voltage when the load circuit is in the active mode and which is inactive when the load circuit is in the standby mode.

The above objects of the present invention are also achieved by a voltage step-down circuit comprising a first transistor having an input terminal supplied with a first power supply voltage, a control terminal and an output terminal through which a step-down voltage derived from the first power supply voltage is output; a voltage dividing circuit having an input terminal connected to the output terminal of the first transistor; a first control circuit which compares a reference voltage with a voltage of the output terminal of the voltage dividing circuit and controls a voltage of the control terminal of the first transistor so that the step-down voltage is controlled by a feedback control; and a current path circuit having an input terminal connected to the output terminal of the first transistor, and an output terminal connected to a power supply voltage input terminal supplied with a second power supply voltage lower than the first power supply voltage, the current path circuit causing, when the load circuit is in an active mode, a larger amount of current to flow to the power supply voltage input terminal when a smaller amount of current flows in the load circuit.

The voltage step-down circuit may further comprise a reference voltage generating circuit which generates the reference voltage when the load circuit is in the active mode and which is inactive when the load circuit is in the standby mode.

In the step-down circuit, the current path circuit may comprise a second transistor having an input terminal connected to the output terminal of the first transistor, an output terminal connected to the power supply voltage input terminal, and a control terminal connected to the control terminal of the first transistor.

The above objects of the present invention are also achieved by a voltage step-down circuit comprising a first transistor having an input terminal supplied with a first power supply voltage, an output terminal and a control terminal, a step-down voltage derived from the first power supply voltage being output through the output terminal when a load circuit to be driven by the voltage step-down circuit is in an active mode, the first transistor being OFF when the load circuit is in a standby mode; a first voltage dividing circuit having an input terminal connected to the output terminal of the first transistor, and an output terminal; a first control circuit which controls a voltage of the control terminal of the first transistor so that, when the load circuit is in the active mode, a feedback control is performed on the basis of a result of comparing a reference voltage with a voltage of the output terminal of the first voltage dividing circuit, and that, when the load circuit is in the standby mode, the feedback control is stopped and the first transistor is OFF; a current path circuit having an input terminal connected to the output terminal of the first transistor, and an output terminal connected to a power supply voltage input terminal receiving a second power supply voltage lower than the first power supply voltage; a second control circuit which causes, when the load circuit is in the active mode, a larger amount of current to flow to the power supply voltage input terminal when a smaller amount of current flows in the load circuit; and a resistance element which cooperates with the first voltage dividing circuit so that a second voltage dividing circuit is formed so as to divide the first power supply voltage when the load circuit is in the standby mode so that the step-down voltage is applied to the load circuit via the resistance element.

The above current path circuit may comprise a second transistor having an input terminal connected to the output terminal of the first transistor, and an output terminal connected to the power supply voltage input terminal. The second control circuit may comprise a first connection switching element which has a first terminal connected to a control terminal of the second transistor and a second terminal connected to the power supply voltage input terminal and which is OFF when the load circuit is in the active mode and is ON when the load circuit is in the standby mode; and a second connection switching element which has a first terminal connected to the control terminal of the second transistor and a second terminal connected to the control terminal of the first transistor and which is ON when the load circuit is in the active mode and is OFF when the load circuit is in the standby mode.

The above objects of the present invention are also achieved by a voltage step-down circuit comprising a first circuit part which steps down, when a load circuit is in an active mode, a power supply voltage to thereby generate a feedback-controlled step-down voltage used to drive the load circuit; a second circuit part which applies another step-down voltage to the load circuit in order to ensure a predetermined operation of the load circuit when the load circuit is in a standby mode.

The above objects of the present invention are also achieved by a semiconductor device comprising a chip body; a load circuit formed on the chip body; and a voltage step-down circuit which generates a step-down voltage to be applied to the load circuit, the voltage step-down circuit comprising a first transistor which derives the step-down voltage from a power supply voltage, the transistor being formed of a plurality of transistors connected in parallel and located on transistor forming areas spaced apart from each other on the chip body.

The above transistor forming areas may be located in corner portions of the chip body.

The transistor forming areas may be two areas located on a diagonal direction on the chip body.

The transistor forming areas may be four areas located on two diagonal directions on the chip body.

The voltage step-down circuit may comprise a control circuit which controls the first transistor so that the step-down voltage from the power supply voltage is applied to the load circuit when the load circuit is in an active mode. The control circuit is formed in a first area on the chip body. The plurality of transistors forming the first transistor are formed in a second area which is located further out than the load circuit and has a band-shaped area having ends between which the first area is sandwiched.

The voltage step-down circuit may be configured as described above.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 2:
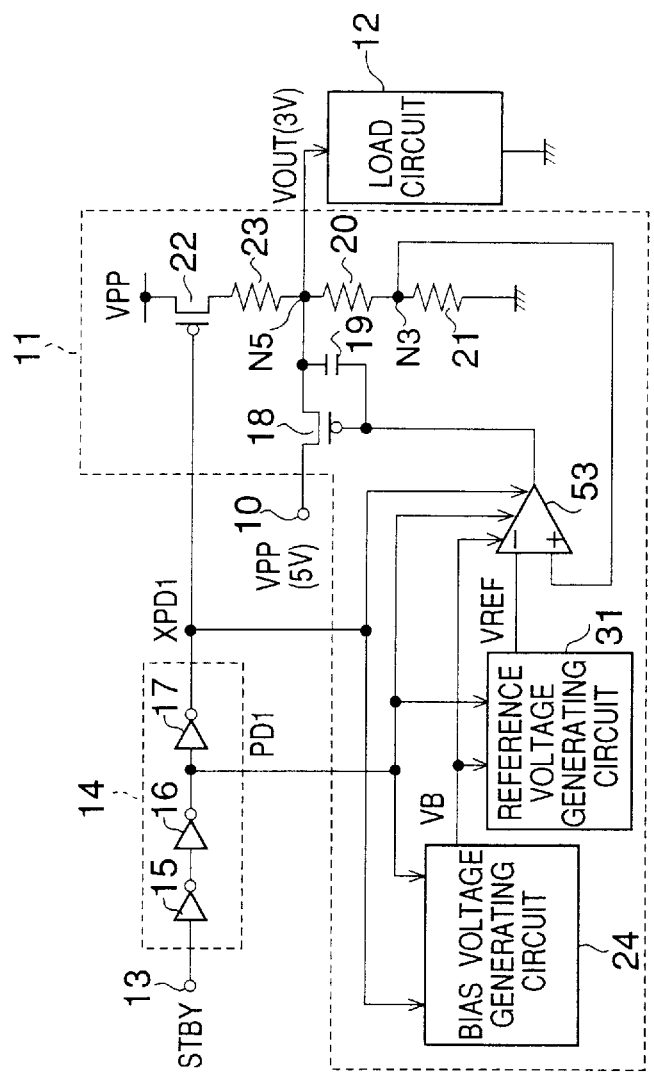
FIG. 2 is a circuit diagram of a semiconductor device equipped with a power supply voltage step-down circuit according to a first embodiment of the present invention.

FIG. 2 is a circuit diagram of a semiconductor device equipped with a power supply voltage step-down circuit according to a first embodiment of the present invention.

The semiconductor device shown in FIG. 2 includes a power supply voltage input terminal 10, a power supply voltage step-down circuit 11, a load circuit 12, a standby signal input terminal 13, and a power-down signal generating circuit 14. A power supply voltage VPP equal to, for example, 5 V is applied to the power supply voltage input terminal 10 from a source external of the semiconductor device. The power supply voltage step-down circuit 11 steps down the power supply voltage VPP and generates a resultant step-down output voltage VOUT equal to, for example, 3V. The load circuit 12 receives, as a power supply voltage, the step-down voltage VOUT from the step-down circuit 11 and operates.

A standby signal STBY is applied to the standby signal input terminal 13 from a source external of the semiconductor device. The power-down signal generating circuit 14, which is made up of inverters 15–17, receives the standby signal STBY and derives therefrom a power-down signal XPD1 which has the inverted phase of the standby signal STBY. The standby signal STBY has a relatively high potential (H level) in the standby mode of the load circuit 12, and a relatively low potential (L level) in the active mode thereof.

The power supply voltage step-down circuit 11 includes a pMOS transistor 18 functioning to step down the power supply voltage VPP, and a capacitor 19 for use in phase compensation. The source of the pMOS transistor 22, which serves as an input terminal, is connected to the power supply voltage input terminal 10, and the drain thereof, which serves as an output terminal, is connected to the load circuit 12.

A voltage dividing circuit is formed of resistors 20 and 21, and detects the value of the step-down voltage VOUT in the active mode. For example, the resistors 20 and 21, respectively, have resistance values of 253 kΩ and 248 kΩ. A pMOS transistor 22 functions as a connection switching element, and is turned ON and OFF in accordance with the power-down signal XPD1. The pMOS transistor 22 is in the OFF state in the active mode, that is, when the power-down signal XPD1 is at the high level. The pMOS transistor 22 is in the ON state in the standby mode, that is, when the power-down signal XPD1 is at the low level. A resistor 23 functions as a component of the above-mentioned voltage dividing circuit including the resistors 20 and 21 in the standby mode, and defines the step-down voltage VOUT. The resistor 23 has a resistance value of, for example, 400 kΩ.

Figure 3:
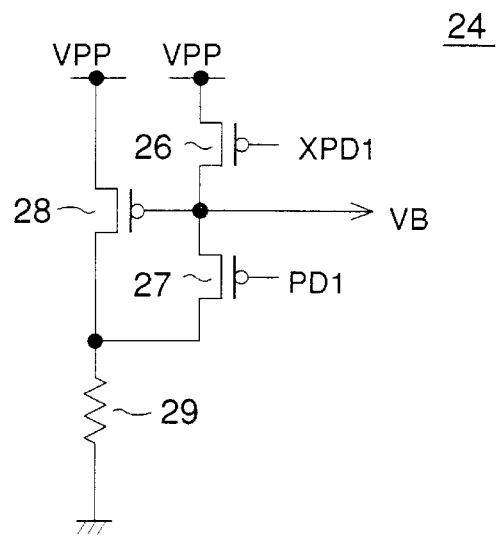
FIG. 3 is a circuit diagram of a bias voltage generating circuit shown in FIG. 2.

A bias voltage generating circuit 24 generates a bias voltage VB, and is configured as shown in FIG. 3. Referring to FIG. 3, the bias voltage generating circuit 24 includes pMOS transistors 26–28, and a resistor 29. The pMOS transistor 26 is turned ON and OFF in response to the power-down signal XPD1. The pMOS transistor 27 is turned ON and OFF in response to a power-down signal PD1 output from the inverter 16 of the circuit 14 shown in FIG. 2.

In the active mode, that is, when the power-down signal XPD1 is at the high level and the power-down signal PD1 is at the low level, the pMOS transistor 26 is OFF and the pMOS transistor 27 is ON. Hence, the gate of the PMOS transistor 28 is coupled to the drain thereof through the pMOS transistor 27, and the bias voltage VB equal to VPP−|VTHp| can be obtained where VTHp denotes the threshold voltage of the PMOS transistor.

In the standby mode, that is, when the power-down signal XPD1 is at the low level and the power-down signal PD1 is at the high level, the pMOS transistor 26 is ON, and the pMOS transistors 27 and 28 are OFF. Hence, the bias voltage VB becomes equal to VPP.

Figure 4:
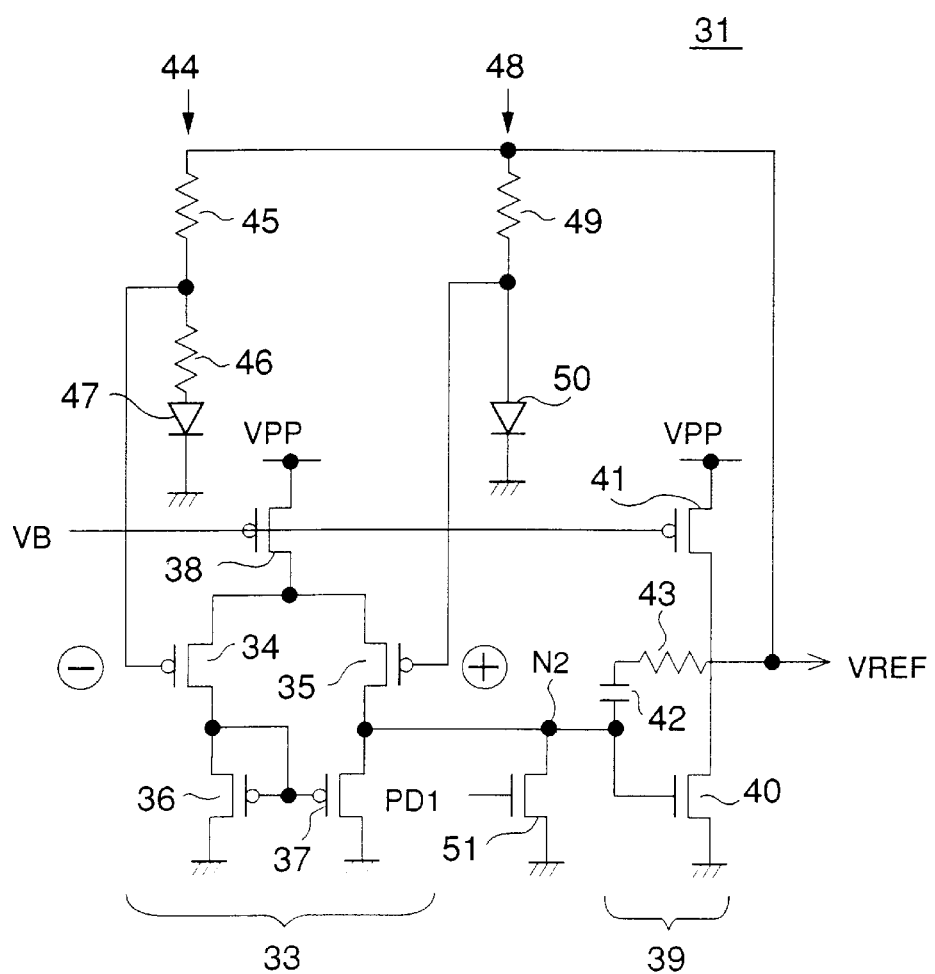
FIG. 4 is a circuit diagram of a reference voltage generating circuit shown in FIG. 2.

Turning now again to FIG. 2, a reference voltage generating circuit 31 of the power supply voltage step-down circuit 11 is supplied with the bias voltage VB from the bias voltage generating circuit 24, and is configured as shown in FIG. 4.

Referring to FIG. 4, the reference voltage generating circuit 31 includes a differential amplifier circuit 33, and an inverting amplifier circuit 39. The differential amplifier circuit 33 includes pMOS transistors 34 and 35 functioning as driving transistors, nMOS transistors 36 and 37 forming a current-mirror load circuit, and a pMOS transistor 38 having a gate supplied with the bias voltage VB. The inverting amplifier circuit 39 includes an nMOS transistor 40 receiving the output signal of the differential amplifier circuit 33, a pMOS transistor having a gate supplied with the bias voltage VB, a phase compensation capacitor 42, and a phase compensation resistor 43.

The reference voltage generating circuit 31 includes an input voltage generating circuit, which generates a voltage to be applied to the inverting input terminal of the differential amplifier circuit 33 on the basis of the reference voltage VREF output from the inverting amplifier circuit 39. The input voltage generating circuit is made up of resistors 45 and 46 and a diode 47.

The reference voltage generating circuit 31 includes an input voltage generating circuit 48, which generates a voltage to be applied to the non-inverting input terminal of the differential amplifier circuit 33 on the basis of the reference voltage VREF output from the inverting amplifier circuit 39. The circuit 48 includes a resistor 49 and a diode 50. An nMOS transistor 51 is turned ON and OFF in response to the power-down signal PD1. In the active mode, that is, when the power-down signal PD1 is at the low level, the nMOS transistor 51 is OFF. In the standby mode, that is, when the power-down signal PD1 is at the high level, the nMOS transistor 51 is ON.

In the active mode, that is, when the bias voltage VB is equal to VPP−|VTHp|, the pMOS transistors 38 and 41 of the reference voltage generating circuit 31 are turned ON and function as resistors. Hence, the differential amplifier circuit 33 and the inverting amplifier circuit 39 are activated, and the nMOS transistor 51 is turned OFF, and thus the reference voltage VREF equal to 1.24 V is output.

In the standby mode, that is, when the bias voltage VB is equal to VPP, the pMOS transistors 38 and 41 are turned OFF, and the differential amplifier circuit 33 and the inverting amplifier circuit 39 are made inactive. Hence, the circuit is in a state in which no current flows. Further, the nMOS transistor 51 is turned ON and the potential of the node N2 is fixed to VSS (ground level). Hence, the output terminal is maintained at the high-impedance state.

Turning now to FIG. 2 again, an operational amplifier 53 is supplied with the bias voltage VB from the bias voltage generating circuit 24, and functions as a control circuit which controls the gate voltage of the pMOS transistor 18 in cooperation with the reference voltage generating circuit 31. The inverting input terminal of the operational amplifier 53 is connected to the output terminal of the reference voltage generating circuit 31, and the non-inverting input terminal thereof is connected to a node N3, which is the output terminal of the voltage dividing circuit made up of the resistors 20 and 21. The output terminal of the operational amplifier 53 is connected to the gate of the pMOS transistor 18 functioning as a control terminal.

Figure 5:
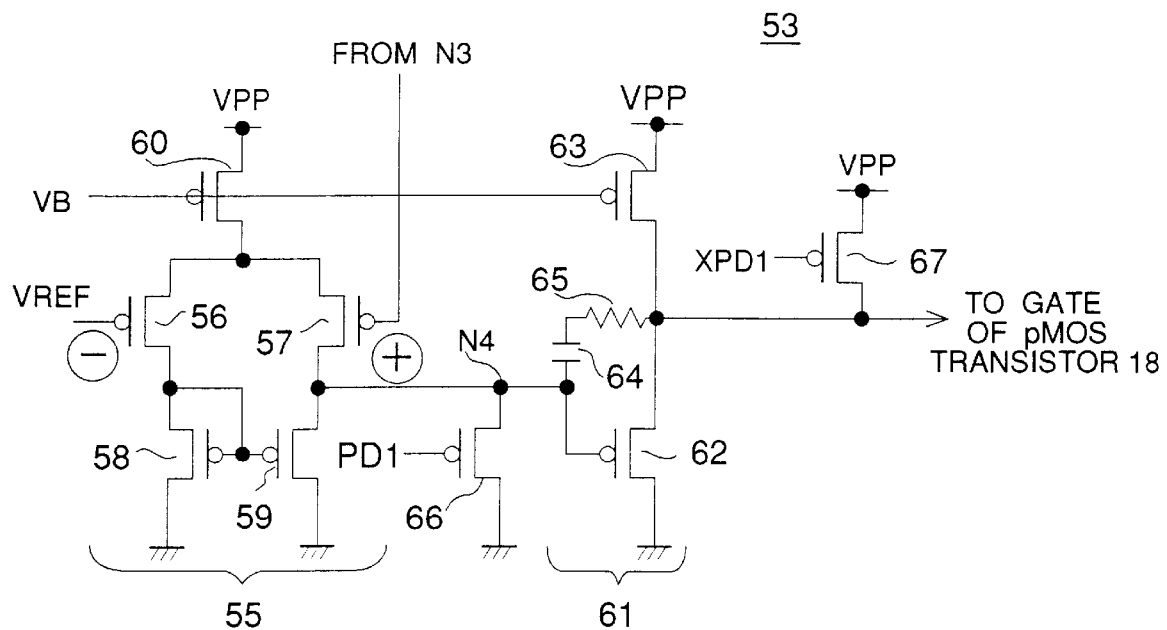
FIG. 5 is a circuit diagram of an operational amplifier shown in FIG. 2.

The operational amplifier 53 is configured as shown in FIG. 5. The operational amplifier 53 includes a differential amplifier circuit 55, which includes pMOS transistors 58 and 59 serving as driving transistors, nMOS transistors 58 and 59 forming a current-mirror load circuit, and a pMOS transistor 60 having a gate supplied with the bias voltage VB. The operational amplifier 53 includes an inverting amplifier circuit 61, which includes an nMOS transistor 62 receiving the output signal of the differential amplifier circuit 55, a PMOS transistor 63 having a gate supplied with the bias voltage VB, a phase compensation capacitor 64, and a phase compensation resistor 65.

The operational amplifier 53 includes an nMOS transistor 66, which is turned ON and OFF in response to the power-down signal PD1. In the active mode, that is, when the power-down signal PD1 is at the low level, the NMOS transistor 66 is OFF. In the standby mode, that is, when the power-down signal PD1 is at the high level, the nMOS transistor 66 is ON.

The operational amplifier 53 includes a pMOS transistor 67, which is turned ON and OFF in response to the power-down signal XPD1. In the active mode, that is, when the power-down signal XPD1 is at the high level, the pMOS transistor 67 is OFF. In the standby mode, that is, when the power-down signal XPD1 is at the low level, the PMOS transistor 67 is ON.

In the active mode, that is, when the bias voltage VB is equal to VPP−|VTHp|, the PMOS transistors 60 and 63 are ON and function as resistors. Hence, the differential amplifier circuit 55 and the inverting amplifier circuit 61 are activated. Further, the nMOS transistor 66 is turned OFF and the pMOS transistor 67 is turned OFF. Hence, the operational amplifier 53 compares the reference voltage VREF supplied from the reference voltage generating circuit 31 with the voltage of the node N3 which is the output terminal of the voltage dividing circuit made up of the resistors 20 and 21. Then, the operational amplifier 53 generates a resultant control signal applied to the gate of the pMOS transistor 18 so that the step-down voltage VOUT is always maintained at 3 V by the above feedback control.

In the standby mode, that is, when the bias voltage VB is equal to VPP, the pMOS transistors 60 and 63 are OFF, and the differential amplifier circuit 55 and the inverting amplifier circuit 61 are made inactive. Hence, no current flows in the differential amplifier circuit 55 and the inverting amplifier circuit 61 from the power supply line. In this case, the nMOS transistor 66 is ON, and the node N4 is fixed to VSS. Further, the pMOS transistor 67 is ON, and the output voltage of the operational amplifier 53 is fixed to VPP.

As described above, in the power supply voltage step-down circuit 11, the reference voltage VREF equal to 1.24 V is output from the reference voltage generating circuit 31 in the active mode. The operational amplifier 53 compares the voltage of the node N3 with the reference voltage VREF (equal to 1.24 V). The operational amplifier 53 controls the gate voltage of the pMOS transistor 18, and the step-down voltage VOUT is maintained at 3 V.

In the standby mode, the output terminal of the reference voltage generating circuit 31 is maintained in the high-impedance state. Further, the output voltage of the operational amplifier 53 is equal to VPP, and the pMOS transistors 18 and 22 are OFF and ON, respectively.

Figure 6:
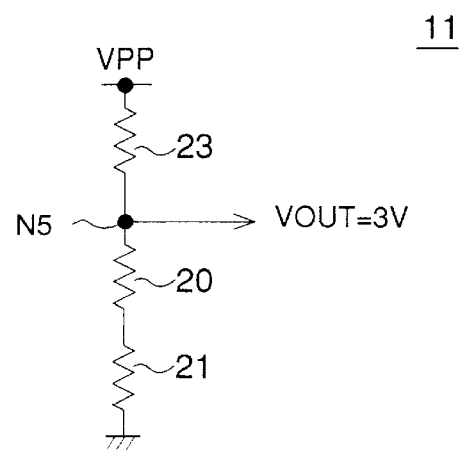
FIG. 6 is a circuit diagram which shows an operation of the power supply voltage step-down circuit in a standby mode.

Thus, as shown in FIG. 6, the resistor 23 forms the voltage dividing circuit in cooperation with the resistors 20 and 21. The step-down voltage VOUT equal to 3 V as defined by the following equation is obtained at a node N5 at which the resistors 23 and 20 are connected:

$$\begin{aligned}
VOUT &= VPP \times \text{(sum of the resistance values} \\
&\quad \text{of resistors 20 and 21)/(sum of the} \\
&\quad \text{resistance values of resistors} \\
&\quad \text{23, 20 and 21)} \\
&= 5 \times [(352 + 248) \times 10^3]/ \\
&\quad [(400 + 352 + 248) \times 10^3 \\
&= 3 \, [V].
\end{aligned}$$

According to the first embodiment of the present invention, the reference voltage generating circuit 31 is in the inactive state in the standby mode, so that no current from the power supply line flows in the reference voltage generating circuit 31. Further, in the operational amplifier 53, the differential amplifier circuit 55 and the inverting amplifier circuit 61 are in the inactive state, so that no currents from the power supply line flow in these circuits. Further, the pMOS transistor 18 is maintained in the OFF state, and the step-down voltage VOUT is defined by the resistors 23, 20 and 21. Thus, the data holding operation of the load circuit 12 can be ensured in the standby mode. Additionally, the power consumed in the standby mode can be reduced, and the power consumption of the semiconductor device can be reduced.

Figure 7:
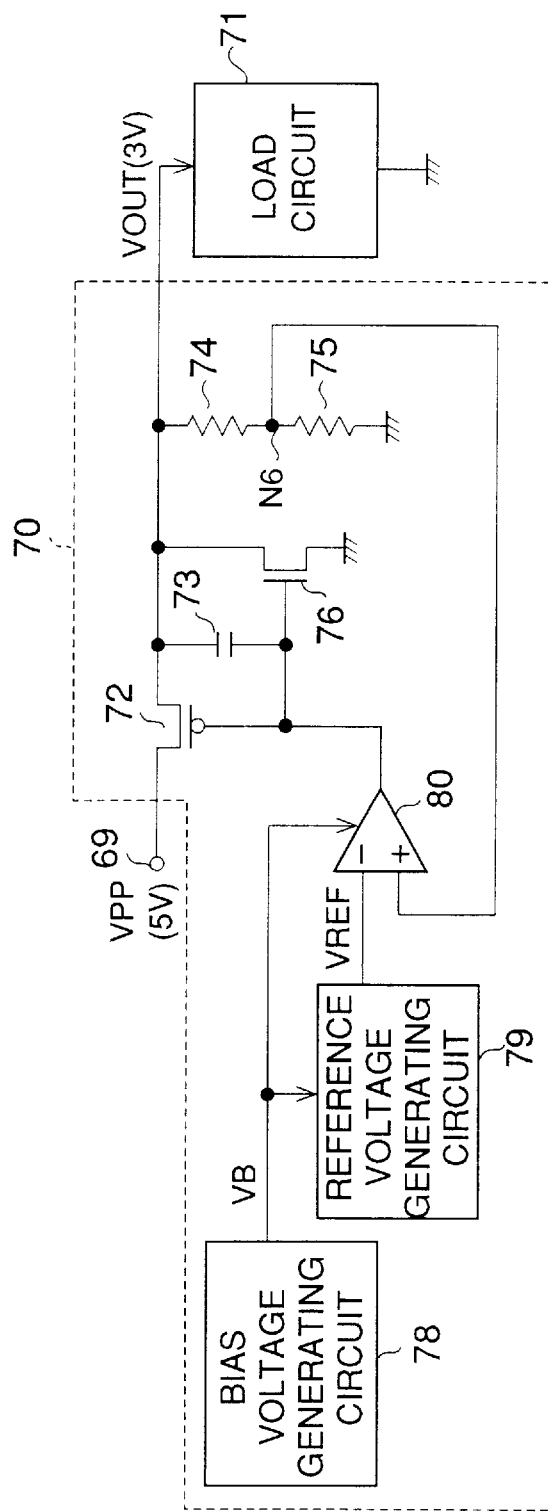
FIG. 7 is a circuit diagram of a semiconductor device equipped with a power supply voltage step-down circuit according to a second embodiment of the present invention.

A description will now be given of a second embodiment of the present invention. FIG. 7 is a circuit diagram of a semiconductor device equipped with a power supply voltage step-down circuit according to the second embodiment of the present invention.

The semiconductor device shown in FIG. 7 has a power supply voltage input terminal 69, a power supply voltage step-down circuit 70 and a load circuit 71. The power supply voltage VPP equal to, for example, 5 V, is applied to the input terminal 69. The step-down circuit 70 steps down the power supply voltage VPP to a voltage equal to, for example, 3 V. The load circuit 71 receives the step-down voltage VOUT output by the step-down circuit 70 and operates.

The step-down circuit 70 includes a pMOS transistor 72 which steps down the power supply voltage VPP to thereby generate the step-down voltage VOUT used to drive the load circuit 71. A phase compensation capacitor 73 is provided as shown in FIG. 7. The source of the PMOS transistor 72, which serves as an input terminal thereof, is connected to the power supply voltage input terminal 69, and the drain thereof, which serves as an output terminal, is connected to the load circuit 71. Resistors 74 and 75 form a voltage dividing circuit which detects the value of the step-down voltage VOUT, and have resistance values of, for example, 352 kΩ and 248 kΩ. An nMOS transistor 76 forms a current path circuit. The drain of the nMOS transistor 76, which serves as an input terminal thereof, is connected to the drain of the pMOS transistor 72, and the source, which serves as an output terminal, is grounded.

Figure 8:
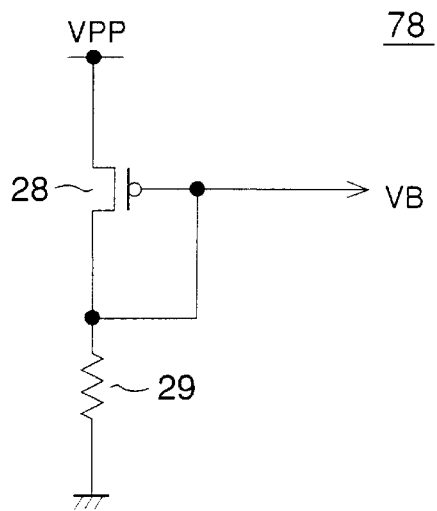
FIG. 8 is a circuit diagram of a bias voltage generating circuit shown in FIG. 7.

The power supply voltage step-down circuit 70 includes a bias voltage generating circuit 78 and a reference voltage generating circuit 79. The circuit 78 generates the bias voltage VB, and is configured as shown in FIG. 8. Referring to FIG. 8, the circuit 78 includes only the pMOS transistor 28, and does not have the pMOS transistors 26 and 27. The gate of the pMOS transistor 28 shown in FIG. 8 is connected to the drain thereof. The bias voltage generating circuit 78 outputs the bias voltage VB equal to VPP−|VTHp| irrespective of the active mode or the standby mode.

Figure 9:
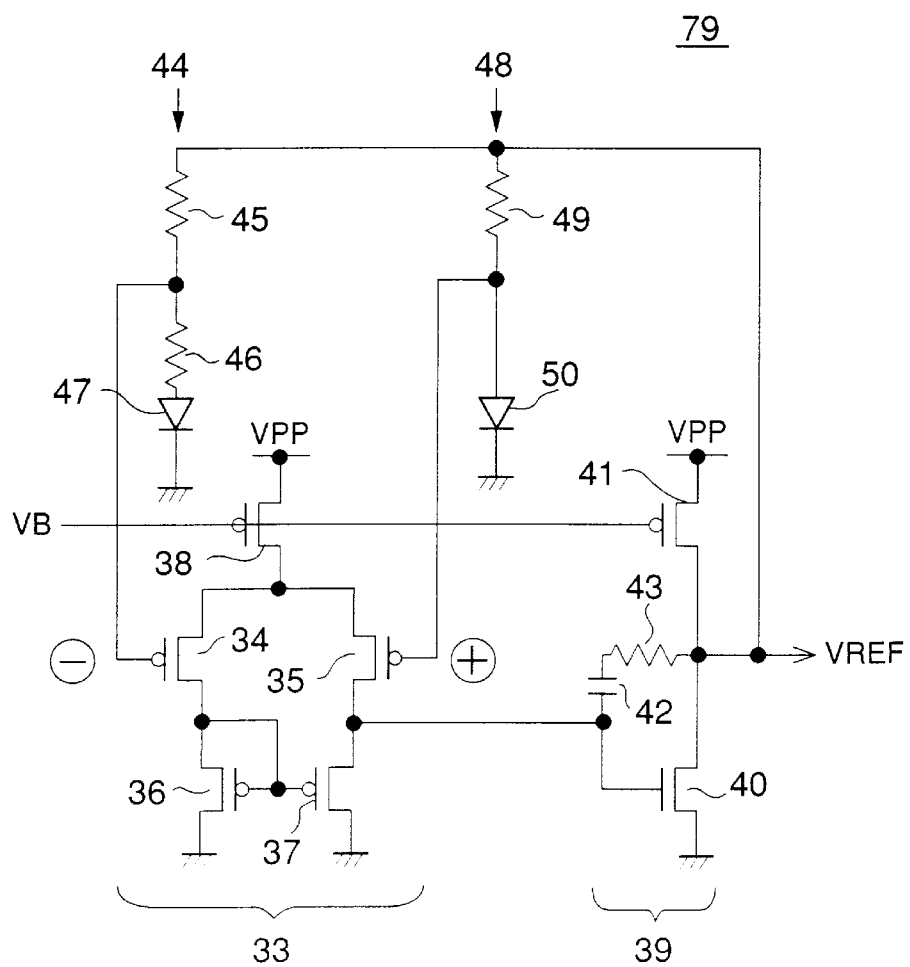
FIG. 9 is a circuit diagram of a reference voltage generating circuit shown in FIG. 7.

The reference voltage generating circuit 79 shown in FIG. 7 is configured as shown in FIG. 9. The circuit configuration shown in FIG. 9 differs from that shown in FIG. 4 in that the circuit shown in FIG. 9 does not have nMOS transistor 51 shown in FIG. 4. The other parts of the circuit 79 shown in FIG. 9 are the same as those of the circuit 31 shown in FIG. 4. The reference voltage generating circuit 79 outputs the reference voltage VREF equal to 1.24 V irrespective of the active mode or the standby mode.

Turning now to FIG. 7 again, the power supply voltage step-down circuit 70 includes an operational amplifier 80 supplied with the bias voltage VB from the bias voltage generating circuit 78. The operational amplifier 80 forms a control circuit in cooperation with the reference voltage generating circuit 79, the above control circuit controlling the gate voltage of the pMOS transistor 72. The inverting input terminal of the operational amplifier 80 is connected to the output terminal of the reference voltage generating circuit 79, and the non-inverting input terminal thereof is connected to a node N6 which is the output terminal of the voltage dividing circuit made up of the resistors 74 and 75. The output terminal of the operational amplifier 80 is connected to the gate of the pMOS transistor 72 serving as the control terminal thereof, and is connected to the gate of the nMOS transistor 76 serving as the control terminal thereof.

Figure 10:
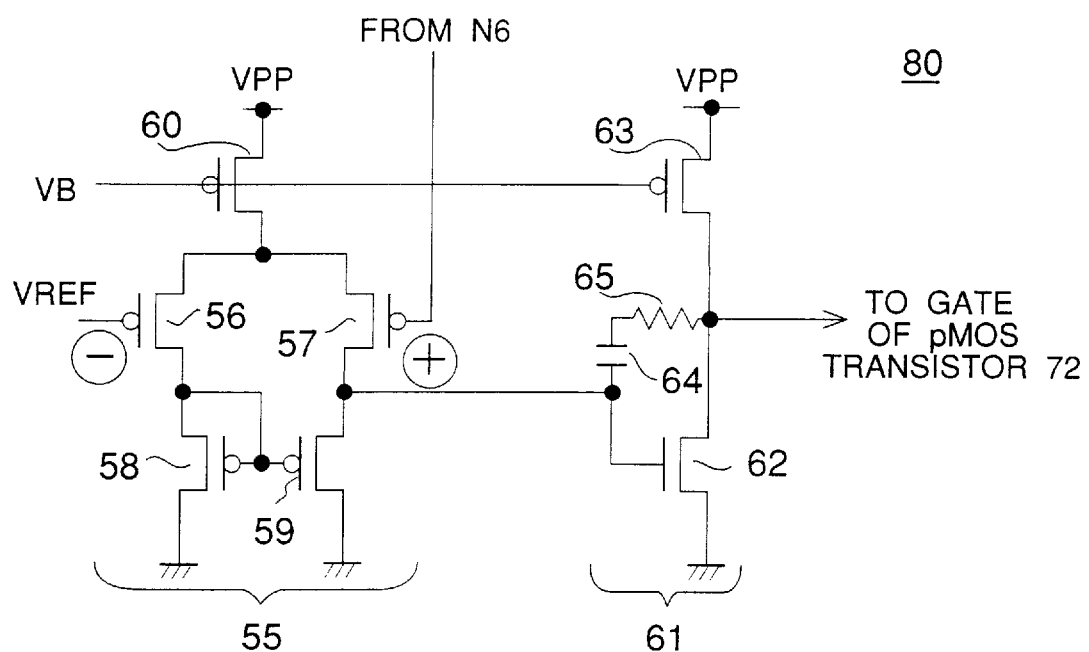
FIG. 10 is a circuit diagram of an operational amplifier shown in FIG. 7.

As shown in FIG. 10, the operational amplifier 80 does not have the nMOS transistor 66 and the pMOS transistor 67 which are provided in the operational amplifier 53 shown in FIG. 5. The other parts of the operational amplifier 80 are the same as those of the operational amplifier 53 shown in FIG. 5. The operational amplifier 80 performs the feedback control of the step-down voltage VOUT irrespective of the active mode or the standby mode.

In the power supply voltage step-down circuit 70 thus configured, the reference voltage VREF equal to 1.24 V is output by the reference voltage generating circuit 79 irrespective of whether the device is in the active mode or in the standby mode. The operational amplifier 80 compares the voltage of the node N6 with the reference voltage VREF, and controls the gate voltage of the pMOS transistor 72 so that the step-down voltage can be maintained at 3 V.

If the semiconductor device shifts to a state in which no current flows in the load circuit 71 in the active mode, the step-down voltage VOUT will be increased. However, the output voltage of the operational amplifier 80 increases so that the step-down voltage VOUT is maintained at 3 V. Hence, the current flowing in the NMOS transistor 76 is increased, and the pMOS transistor 72 does not shift to a state close to the OFF state. Thereafter, when a current starts to flow to the load circuit 71, it is possible to supply the load circuit 71 with a sufficient current and to thus prevent occurrence of a ripple in the step-down voltage VOUT. Hence, it is possible to prevent the load circuit 71 from malfunctioning due to the ripple in the step-down voltage VOUT.

Figure 11:
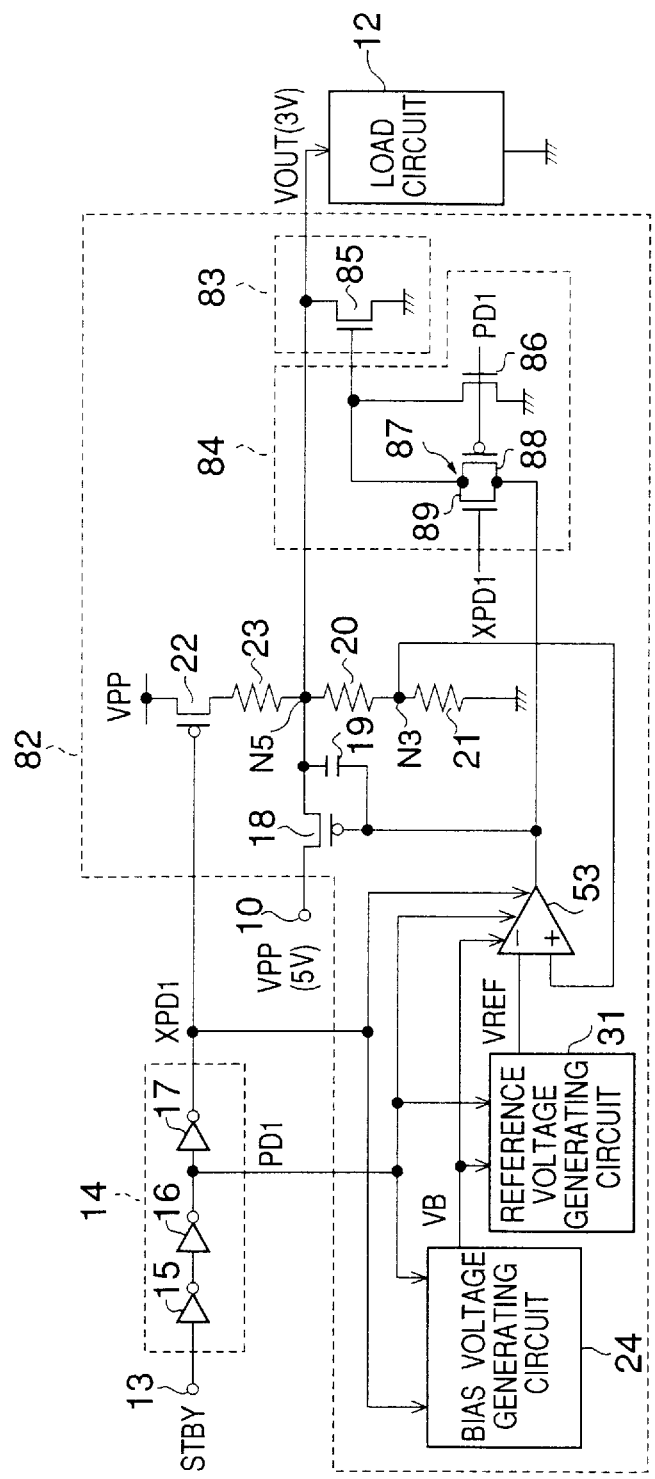
FIG. 11 is a circuit diagram of a semiconductor device equipped with a power supply voltage step-down circuit according to a third embodiment of the present invention.

A description will now be given of a third embodiment of the present invention. FIG. 11 is a circuit diagram of a semiconductor device equipped with a power supply voltage step-down circuit according to the third embodiment of the present invention. The semiconductor device shown in FIG. 11 uses a power supply voltage step-down circuit 82 instead of the power supply voltage step-down circuit 11 used in the first embodiment of the present invention. The other parts of the semiconductor device shown in FIG. 11 are the same as those of the semiconductor device shown in FIG. 2.

The power supply voltage step-down circuit 82 has a current path circuit 83 and a current path control circuit 84, which controls a current passing operation of the current path circuit 83. The other parts of the circuit 82 are the same as those of the circuit 11 shown in FIG. 2. The current path circuit 83 includes an nMOS transistor 85. The current path control circuit 84 includes an nMOS transistor 86, and an analog switch circuit 87. The nMOS transistor 86 functions as a connection switching element, which switches over in response to the power-down signal PD1. The analog switch circuit 87, which functions as another connection switching element, is comprised of a pMOS transistor 88 and an nMOS transistor 89. The pMOS transistor 88 is turned ON and OFF in response to the standby signal PD1. The nMOS transistor 89 is turned ON and OFF in response to the standby signal XPD1.

In the active mode, that is, when the standby signal PD1 is at the low level and the standby signal XPD1 is at the high level, the nMOS transistor 86 is OFF and the analog switch circuit 87 is ON. Hence, the gate of the nMOS transistor 85 is connected to the output terminal of the operational amplifier 53.

In the standby mode, that is, when the power-down signal PD1 is at the high level and the power-down signal XPD1 is at the low level, the nMOS transistor 86 is ON, and the analog switch circuit 87 is OFF. Hence, the nMOS transistor 85 is OFF.

In the power supply voltage step-down circuit 82 thus configured, in the active mode, the reference voltage VREF equal to 1.24 V is output from the reference voltage generating circuit 31. In the operational amplifier 53, the reference voltage VREF is compared with the voltage of the node N3. The comparison result controls the gate voltage of the pMOS transistor 18, so that the step-down voltage VOUT is maintained at 3 V. Further, the output voltage of the operational amplifier 53 is supplied to the gate of the nMOS transistor 85 through the analog switch circuit 87. Hence, the nMOS transistor 85 functions as a variable resistance element.

In this case, if the circuit switches to a state in which no current flows in the load circuit 12, the step-down voltage VOUT will be increased. However, the output voltage of the operational amplifier 53 is increased so that the step-down voltage VOUT is maintained at 3 V. Hence, the current flowing in the nMOS transistor 85 is increased, and the pMOS transistor 18 is not changed to a state close to the OFF state. Thereafter, when a current starts to flow in the load circuit 12, it is possible to supply the load circuit 12 with a sufficient current and to thus prevent occurrence of a ripple in the step-down voltage VOUT. Hence, it is possible to prevent the load circuit 12 from malfunctioning due to the ripple in the step-down voltage VOUT.

In the standby mode, the output terminal of the reference voltage generating circuit 31 is switched to the high-impedance state. The output voltage of the operational amplifier 53 is equal to VPP, and the pMOS transistors 18 and 22 are respectively OFF and ON. Further, the gate of the nMOS transistor 85 is grounded through the nMOS transistor 86, and the nMOS transistor 85 is switched to OFF.

Hence, as in the case shown in FIG. 6, the resistor 23 cooperates with the resistors 20 and 21 to configure the voltage dividing circuit. The step-down voltage VOUT equal to 3 V as defined by the following equation is obtained at the node N5 at which the resistors 23 and 20 are connected:

$$\begin{aligned} VOUT &= VPP \times \text{(sum of the resistance values} \\ &\quad \text{of resistors 20 and 21)/(sum of the} \\ &\quad \text{resistance values of resistors} \\ &\quad \text{23, 20 and 21)} \\ &= 5 \times [(352 + 248) \times 10^3]/ \\ &\quad [(400 + 352 + 248) \times 10^3 \\ &= 3 \, [V]. \end{aligned}$$

According to the third embodiment of the present invention, the reference voltage generating circuit 82 functions to prevent occurrence of a ripple when the current starts to flow in the load circuit 12 from the state in which no current flows in the load circuit 12. Hence, it is possible to prevent the load circuit 12 from malfunctioning.

In the standby mode, the reference voltage generating circuit 31 is made inactive in order to prevent current from the power supply line from flowing in the circuit 31. Further, the differential amplifier circuit 55 and the inverting amplifier circuit 61 of the operational amplifier 53 are made inactive in order to prevent currents from flowing in these circuits. Furthermore, the pMOS transistor 18 is maintained in the OFF state, and the step-down voltage VOUT is defined by the resistors 23, 20 and 21. Hence, it is possible to ensure the data holding operation of the load circuit 12 and reduce power consumption in the standby mode.

In the power supply voltage step-down circuits 11 and 82 of the above-mentioned first and third embodiments of the present invention, the pMOS transistor 22 is interposed between the VPP power supply line and the resistor 23. Alternatively, the resistor 23 can be directly connected to the VPP power supply line.

Figure 1:
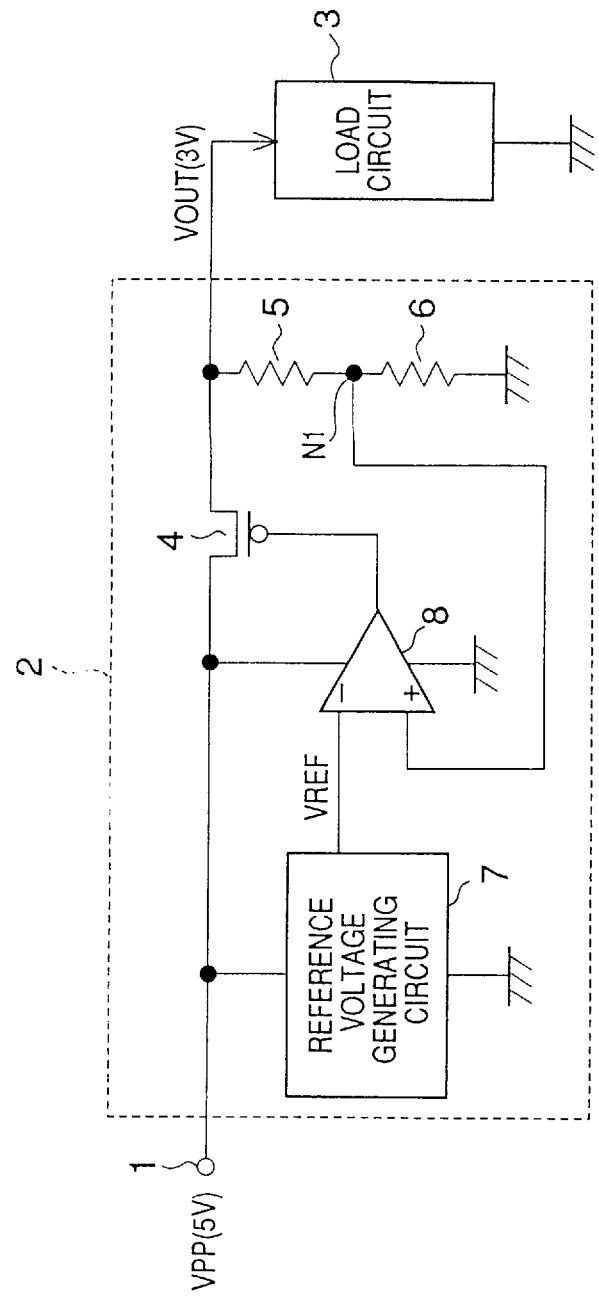
FIG. 1 is a circuit diagram of a part of a semiconductor device equipped with a conventional power supply voltage step-down circuit.
Figure 12:
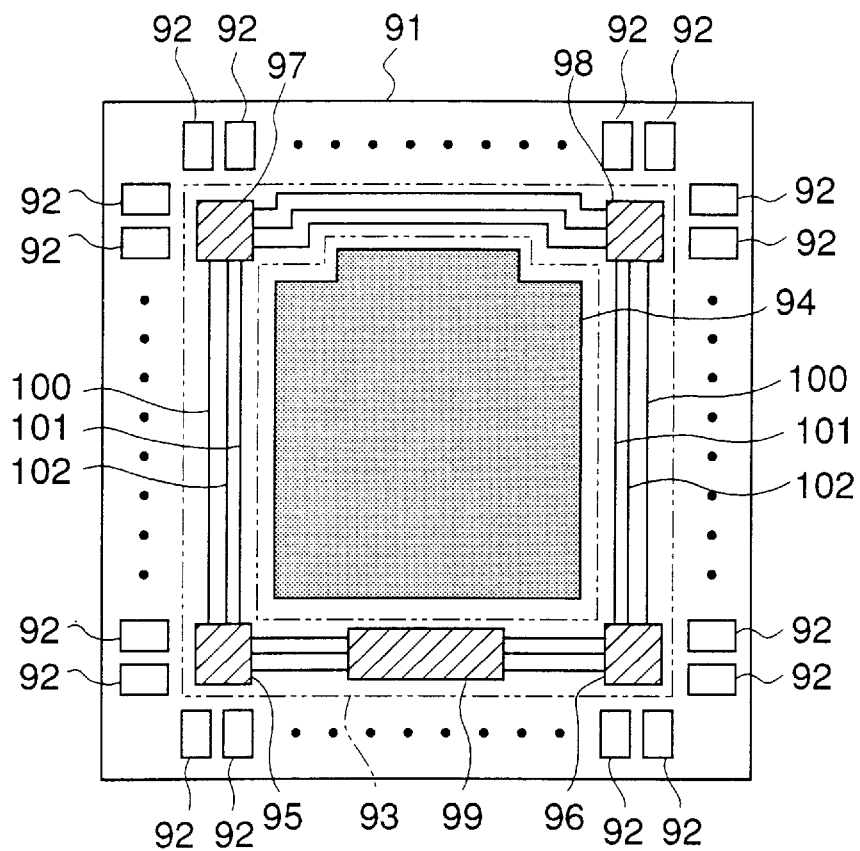
FIG. 12 is a plan view of a semiconductor device according to a fourth embodiment of the present invention.

A description will now be given of a fourth embodiment of the present invention. FIG. 12 is a plan view of a semiconductor device according to the fourth embodiment of the present invention. The device shown in FIG. 12 includes a chip 91, I/O (input/output) cells 92, a power supply voltage step-down circuit 93 having the same circuit configuration as the circuit 2 shown in FIG. 1, and a load circuit 94 which is driven by the step-down circuit 93.

Blocks 95–98 are voltage step-down transistor forming areas in which transistors for stepping down the power supply voltage VPP to generate step-down voltages for driving the load circuit 94 are located. The voltage step-down transistor forming areas 95–98 are located further in from the periphery of the chip 91 than the I/O cells 92 and in corner portions of the chip body 91.

If the voltage step-down transistor forming areas 95–98 are located further in from the periphery of the chip 91 than the I/O cells 92 and in areas other than the above corner portions, a problem will occur in which the layout of wiring lines connecting the I/O cells 92 and the load circuit 94 will become complicated. On the other hand, such a problem does not occur by locating the voltage step-down transistor forming areas 95–98 further in from the periphery than the I/O cells 92 and in the corner portions of the chip body 91.

A block 99 denotes a circuit portion other than the voltage step-down transistors. VPP lines 100 carry the power supply voltage VPP supplied from the outside of the chip body 91. VOUT lines 101 carry the voltage step-down voltage VOUT. Gate lines 102 are lines connected to the step-down transistors.

Figure 13:
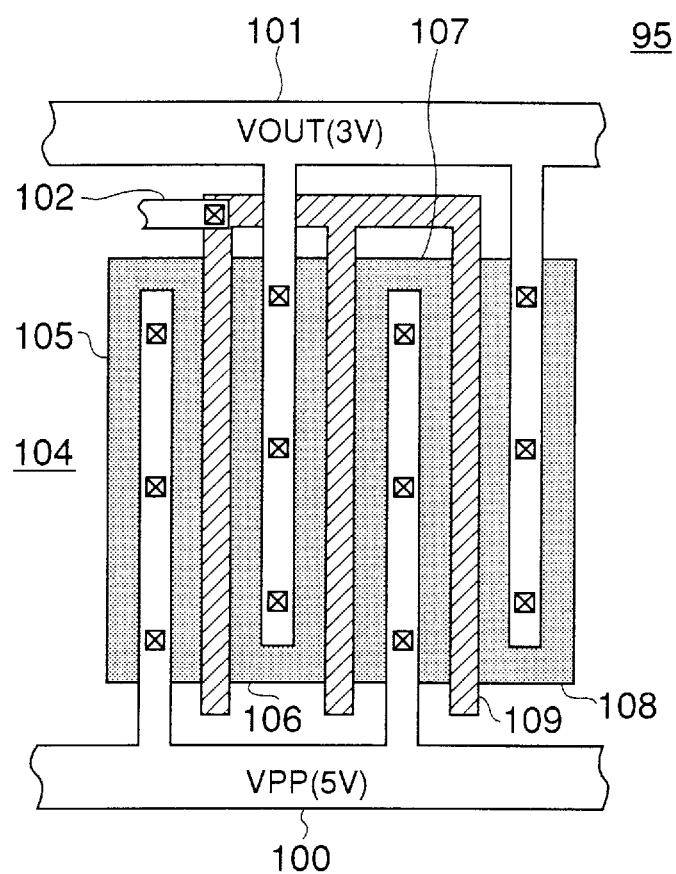
FIG. 13 is a plan view of a voltage step-down transistor forming area shown in FIG. 12.

FIG. 13 is a plan view of the voltage step-down transistor forming area 95 shown in FIG. 12. Provided in the area 95 are an n-type well 104, p-type impurity diffused areas 105–108, and a gate electrode 109 having a comb-shaped structure. A pMOS transistor is formed so that the p-type diffused areas 105 and 107 serve as a source, and the p-type diffused areas 106 and 108 serve as a drain.

In the above manner, four pMOS transistors are respectively formed in the transistor forming areas 95–98. The four pMOS transistors are connected in parallel and form the single pMOS transistor 4 shown in FIG. 1. Hence, the heat generated from the pMOS transistor 4 can be distributed to the transistor forming areas 95–98. It will be noted that the conventional semiconductor device has a single voltage step-down transistor forming area on the chip. Thus, heat generated by the step-down transistor concentrates on the single voltage step-down transistor forming area. Hence, transistors close to the above area have relatively high junction temperatures, and transistors far from the above area have relatively low junction temperatures. That is, the transistors of the load circuit have different characteristics based on the positions thereof with respect to the voltage step-down transistor forming area. In other words, there is a large gradation of the junction temperature on the chip. Such a large gradation of the junction temperature causes racing, which causes malfunctions of the load circuit.

On the other hand, according to the arrangement shown in FIGS. 12 and 13, it is possible to make the transistors have almost equal junction temperatures and thus reduce the gradation of the junction temperature. Hence, it is possible to prevent the load circuit 94 from malfunctioning.

Alternatively, it is possible to provide two or three voltage step-down transistor forming areas in one or two diagonal directions. If two voltage step-down transistor forming areas are used, it will be advantageous to locate the areas in a diagonal direction. It is also possible to replace the power supply voltage step-down circuit 2 by the aforementioned power supply voltage step-down circuit 11, 70 or 82.

More particularly, when the step-down circuit 11 is applied to the arrangement shown in FIG. 12, it is possible to prevent the load circuit 94 from malfunctioning due to the racing and reduce power consumption in the standby mode.

When the step-down circuit 70 is applied to the arrangement shown in FIG. 12, it is possible to prevent, in the active mode, the load circuit 94 from malfunctioning due to racing and to prevent occurrence of a ripple in the step-down voltage when a current starts to flow in the load circuit from a state in which no current flows therein. Thus, the load circuit 94 can be prevented from malfunctioning due to the occurrence of a ripple.

When the step-down circuit 82 is applied to the arrangement shown in FIG. 12, it is possible to prevent, in the active mode, the load circuit 94 from malfunctioning due to racing and to prevent occurrence of a ripple in the step-down voltage when a current starts to flow in the load circuit from a state in which no current flows therein. Thus, the load circuit 94 can be prevented from malfunctioning due to the occurrence of a ripple. Further, it is possible to prevent the load circuit 94 from malfunctioning due to racing and to reduce power consumption in the standby mode.

A description will now be given of a fifth embodiment of the present invention with reference to FIG. 14, which is a plan view of a semiconductor device according to the fifth embodiment of the present invention.

Figure 14:
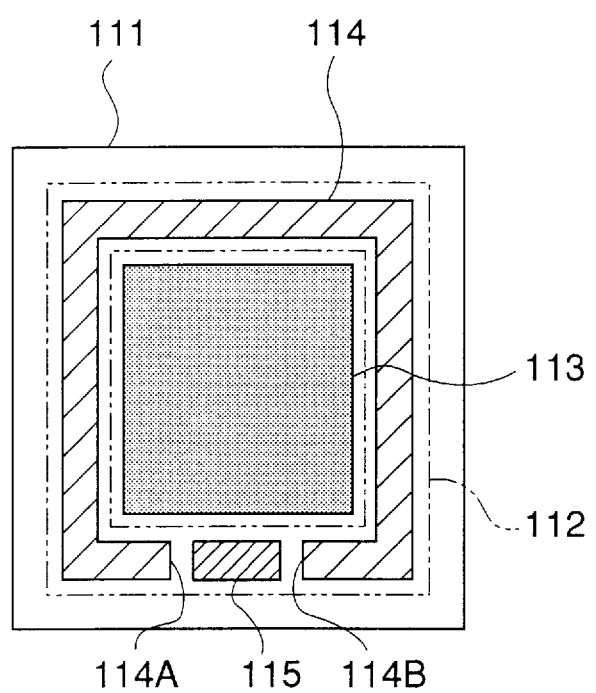
FIG. 14 is a plan view of a semiconductor device according to a fifth embodiment of the present invention.

The semiconductor device shown in FIG. 14 has a chip body 111, a power supply voltage step-down circuit 112 having the same configuration as the circuit 2, and a load circuit 113 powered by the circuit 112. The power supply voltage step-down circuit 112 includes a voltage step-down transistor forming area 114, and a circuit portion 115 other than the area 114. A plurality of pMOS transistors used to step down the power supply voltage VPP and drive the load circuit 113 are formed in the area 114.

More particularly, the transistor forming area 114 having substantially a band shape is located closer to the periphery of the chip body 111 than the load circuit 113 so that the circuit portion 115 is sandwiched between an end 114A of the area 114 and another end 114B thereof. Heat generated by the step-down pMOS transistors does not concentrate on a very limited area but is widely spread. Hence, it is possible to reduce the gradation of the junction temperature of transistors of the load circuit 113 caused by heat generated by the step-down pMOS transistors. In other words, it is possible to make the transistors of the load circuit 113 have almost the same characteristics irrespective of the positions thereof. Hence, it is possible to prevent occurrence of racing due to a large gradation of the junction temperature and thus prevent the load circuit 113 from malfunctioning due to the racing.

It is also possible to replace the power supply voltage step-down circuit 2 employed in the structure shown in FIG. 14 by the aforementioned power supply voltage step-down circuit 11, 70 or 82.

More particularly, when the step-down circuit 11 is applied to the arrangement shown in FIG. 14, it is possible to prevent the load circuit 113 from malfunctioning due to racing and to reduce power consumption in the standby mode.

When the step-down circuit 70 is applied to the arrangement shown in FIG. 14, it is possible to prevent, in the active mode, the load circuit 113 from malfunctioning due to racing and to prevent occurrence of a ripple in the step-down voltage when a current starts to flow in the load circuit from a state in which no current flows therein. Thus, the load circuit 113 can be prevented from malfunctioning due to the occurrence of a ripple.

When the step-down circuit 82 is applied to the arrangement shown in FIG. 14, it is possible to prevent, in the active mode, the load circuit 113 from malfunctioning due to racing and to prevent occurrence of a ripple in the step-down voltage when a current starts to flow in the load circuit from a state in which no current flows therein. Thus, the load circuit 113 can be prevented from malfunctioning due to the occurrence of a ripple. Further, it is possible to prevent the load circuit 113 from malfunctioning due to racing and to reduce power consumption in the standby mode.

The present invention is not limited to the specifically disclosed embodiments, and variations and modifications may be made without departing from the scope of the present invention.

What is claimed is:

1. A voltage step-down circuit selectively switched between active and standby modes by an externally supplied mode signal, comprising:

a first transistor having an input terminal supplied with a first power supply voltage, an output terminal and a control terminal, a step-down voltage derived from the first power supply voltage being output through the output terminal when a load circuit to be driven by the voltage step-down circuit is in the active mode, the first transistor being OFF when the load circuit is in the standby mode;

a first voltage dividing circuit having an input terminal connected to the output terminal of the first transistor and an output terminal;

a first control circuit which controls an input voltage level of the control terminal of the first transistor so that, when the load circuit is in the active mode, a feedback control is performed on the basis of a result of comparing a reference voltage with an output voltage of the output terminal of the first voltage dividing circuit and so that, when the load circuit is in the standby mode, the feedback control is stopped and the first transistor is OFF; and a resistance element connected to the first voltage dividing circuit to form a second voltage dividing circuit dividing the first power supply voltage when the load circuit is in the standby mode so that the step-down voltage is applied to the load circuit via the resistance element.

2. The voltage step-down circuit as claimed in claim 1, further comprising:

a reference voltage generating circuit which generates the reference voltage when the load circuit is in the active mode and which is inactive when the load circuit is in the standby mode.

3. A voltage step-down circuit comprising:

a first transistor having an input terminal supplied with a first power supply voltage, a control terminal and an output terminal through which a step-down voltage derived from the first power supply voltage is output;

a voltage dividing circuit having an input terminal connected to the output terminal of the first transistor;

a first control circuit which compares a reference voltage with an output voltage of the output terminal of the voltage dividing circuit and controls an input voltage level of the control terminal of the first transistor so that the step-down voltage is controlled by a feedback control; and a current path circuit having an input terminal connected to the output terminal of the first transistor and an output terminal connected to a power supply voltage input terminal supplied with a second power supply voltage lower than the first power supply voltage, the current path circuit, in an active mode of the load circuit, causing a larger amount of current to flow to the power supply voltage input terminal when a smaller amount of current flows in the load circuit.

4. The voltage step-down circuit as claimed in claim 3, further comprising:

a reference voltage generating circuit which generates the reference voltage when the load circuit is in the active mode and which is inactive when the load circuit is in the standby mode.

5. The voltage step-down circuit as claimed in claim 1, wherein the current path circuit comprises:

a second transistor having an input terminal connected to the output terminal of the first transistor, an output terminal connected to the power supply voltage input terminal, and a control terminal connected to the control terminal of the first transistor.

6. A voltage step-down circuit selectively switched between active and standby modes by an externally supplied mode signal, comprising:

a first transistor having an input terminal supplied with a first power supply voltage, an output terminal and a control terminal, a step-down voltage derived from the first power supply voltage being output through the output terminal when a load circuit to be driven by the voltage step-down circuit is in the active mode, the first transistor being OFF when the load circuit is in the standby mode;

a first voltage dividing circuit having an input terminal connected to the output terminal of the first transistor and an output terminal;

a first control circuit which controls an input voltage level of the control terminal of the first transistor so that, when the load circuit is in the active mode, a feedback control is performed on the basis of a result of comparing a reference voltage with an output voltage of the output terminal of the first voltage dividing circuit and so that, when the load circuit is in the standby mode, the feedback control is stopped and the first transistor is OFF;

a current path circuit having an input terminal connected to the output terminal of the first transistor and an output terminal connected to a power supply voltage input terminal receiving a second power supply voltage of a lower voltage level than a level of the first power supply voltage;

a second control circuit, when the load circuit is in the active mode, causing a larger amount of current to flow to the power supply voltage input terminal when a smaller amount of current flows in the load circuit; and a resistance element connected to the first voltage dividing circuit to form a second voltage dividing circuit dividing the first power supply voltage, when the load circuit is in the standby modes so that the step-down voltage is applied to the load circuit via the resistance element.

7. The voltage step-down circuit as claimed in claim 6, wherein:

the current path circuit comprises a second transistor having an input terminal connected to the output terminal of the first transistor and an output terminal connected to the power supply voltage input terminal; and the second control circuit comprises:

a first connection switching element which has a first terminal connected to a control terminal of the second transistor and a second terminal connected to the power supply voltage input terminal and which is OFF when the load circuit is in the active mode and is ON when the load circuit is in the standby mode, and a second connection switching element which has a first terminal connected to the control terminal of the second transistor and a second terminal connected to the control terminal of the first transistor and which is ON when the load circuit is in the active mode and is OFF when the load circuit is in the standby mode.

8. A voltage step-down circuit comprising:

a first circuit part which steps down, when a load circuit is in an active mode, a power supply voltage to thereby generate a feedback-controlled step-down voltage used to drive the load circuit; and a second circuit part which applies another step-down voltage to the load circuit in order to ensure a predetermined operation of the load circuit when the load circuit is in a standby mode.

9. A semiconductor device selectively switched between active and standby modes by an externally supplied mode signal, comprising:

a chip body;

a load circuit formed on the chip body; and a voltage step-down circuit which generates a step-down voltage to be applied to the load circuit, the voltage step-down circuit comprising a first transistor which derives the step-down voltage from a power supply voltage, said first transistor comprising a plurality of separate transistors connected in parallel and located in respective transistor forming areas spaced apart from each other on the chip body.

10. The semiconductor device as claimed in claim 9, wherein the respective transistor forming areas are located in corresponding corner portions of the chip body.

11. The semiconductor device as claimed in claim 10, wherein the transistor forming areas are two areas spaced apart in a diagonal direction on the chip body.

12. The semiconductor device as claimed in claim 10, wherein the transistor forming areas comprise first and second areas spaced apart in a first diagonal direction on the chip body and third and fourth areas spaced apart in a second diagonal direction, different from the first diagonal direction, on the chip body.

13. The semiconductor device as claimed in claim 9, wherein:

the voltage step-down circuit comprises a control circuit which controls the first transistor so that the step-down voltage from the power supply voltage is applied to the load circuit when the load circuit is in the active mode;

the control circuit is formed in a first area on the chip body; and the first transistor comprising a plurality of transistors, formed in a second, band-shaped area of the chip body which is located further out on the chip body toward the periphery thereof than, and surrounding, the load circuit and has spaced ends between which the first area is located.

14. The semiconductor device as claimed in claim 9, wherein:

the first transistor has an input terminal supplied with a first power supply voltage, an output terminal and a control terminal, a step-down voltage derived from the first power supply voltage being output through the output terminal thereof when a load circuit to be driven by the voltage step-down circuit is in the active mode, the first transistor being OFF when the load circuit is in the standby mode; and the voltage step-down circuit further comprises:

a first voltage dividing circuit having an input terminal connected to the output terminal of the first transistor and an output terminal, first control circuit which controls an input voltage level of the control terminal of the first transistor so that, when the load circuit is in the active mode, a feedback control is performed on the basis of a result of comparing a reference voltage with an output voltage of the output terminal of the first voltage dividing circuit and so that, when the load circuit is in the standby mode, the feedback control is stopped and the first transistor is OFF, and a resistance element connected to the first voltage dividing circuit to form a second voltage dividing circuit dividing the first power supply voltage when the load circuit is in the standby mode so that the step-down voltage is applied to the load circuit via the resistance element.

15. The voltage step-down circuit as claimed in claim 9, wherein:

the first transistor has an input terminal supplied with a first power supply voltage, a control terminal and an output terminal through which a step-down voltage derived from the first power supply voltage is output; and the voltage step-down circuit further comprises:

a voltage dividing circuit having an input terminal connected to the output terminal of the first transistor, a first control circuit which compares a reference voltage with an output voltage of the output terminal of the voltage dividing circuit and controls an input voltage level of the control terminal of the first transistor so that the step-down voltage is controlled by a feedback control, and a current path circuit having an input terminal connected to the output terminal of the first transistor and an output terminal connected to a power supply voltage input terminal supplied with a second power supply voltage lower than the first power supply voltage, the current path circuit, in an active mode of the load circuit, causing a larger amount of current to flow to the power supply voltage input terminal when a smaller amount of current flows in the load circuit.

16. The voltage step-down circuit as claimed in claim 9, wherein:

the first transistor has an input terminal supplied with a first power supply voltage, an output terminal and a control terminal, a step-down voltage derived from the first power supply voltage being output through the output terminal thereof when a load circuit to be driven by the voltage step-down circuit is in the active mode, the first transistor being OFF when the load circuit is in a standby mode;

the voltage step-down circuit further comprises:

a first voltage dividing circuit having an input terminal connected to the output terminal of the first transistor and an output terminal, a first control circuit which controls an input voltage level of the control terminal of the first transistor so that, when the load circuit is in the active mode, a feedback control is performed on the basis of a result of comparing a reference voltage with an output voltage of the output terminal of the first voltage dividing circuit and so that, when the load circuit is in the standby mode, the feedback control is stopped and the first transistor is OFF, a current path circuit having an input terminal connected to the output terminal of the first transistor and an output terminal connected to a power supply voltage input terminal receiving a second power supply voltage of a lower voltage level than a level of the first power supply voltage, a second control circuit, when the load circuit is in the active mode, causing a larger amount of current to flow to the power supply voltage input terminal when a smaller amount of current flows in the load circuit, and a resistance element connected to the first voltage dividing circuit to form a second voltage dividing circuit dividing the first power supply voltages when the load circuit is in the standby modes so that the step-down voltage is applied to the load circuit via the resistance element.

* * * * *

UNITED STATES PATENT AND TRADEMARK OFFICE
CERTIFICATE OF CORRECTION

PATENT NO. : 5,811,861
DATED : September 22, 1998
INVENTOR(S) : Hideo NUNOKAWA

It is certified that error appears in the above-identified patent and that said Letters Patent is hereby corrected as shown below:

Col. 16, line 27, change "modes" to --mode,--.

Col. 18, line 61, change "voltages" to --voltage,--;
line 62, change "modes" to --mode,--.

Signed and Sealed this

Ninth Day of March, 1999

Attest:

Q. TODD DICKINSON

Attesting Officer

Acting Commissioner of Patents and Trademarks